(12) United States Patent
Stegers et al.

(10) Patent No.: US 7,135,894 B1
(45) Date of Patent: Nov. 14, 2006

(54) DUAL-OUTPUT CURRENT DRIVER

(75) Inventors: Marc Gerardus Maria Stegers, Delft (NL); Rudolphe Gustave Hubertus Eschauzier, Bergschenhoek (NL)

(73) Assignee: National Semiconductor Corporation, Santa Clara, CA (US)

( * ) Notice: Subject to any disclaimer, the term of this patent is extended or adjusted under 35 U.S.C. 154(b) by 620 days.

(21) Appl. No.: 10/243,240

(22) Filed: Sep. 13, 2002

(51) Int. Cl.
*H03K 3/00* (2006.01)

(52) U.S. Cl. ........................ 327/108; 330/288

(58) Field of Classification Search ................ 327/108, 327/112; 330/288
See application file for complete search history.

(56) References Cited

U.S. PATENT DOCUMENTS 5,929,664 A * 7/1999 Alleven ....................... 327/108
6,836,144 B1 * 12/2004 Bui et al. ..................... 326/32
6,909,316 B1 * 6/2005 Owens et al. ................ 327/266

OTHER PUBLICATIONS

élantec Press Release, "EL6285C 3-channel DVD/CD Dual Writer LDD; and EL6219C 4-channel DVD/DC Dual Writer LDD," Mar. 18, 2002, 2 pages.
élantec, "EL6290C—Product Brief Laser Diode Driver with Waveform Generator," May 12, 2000, 2 pages.

* cited by examiner

*Primary Examiner*—Kenneth B. Wells
(74) *Attorney, Agent, or Firm*—Brett A. Hertzberg; Merchant & Gould PC

(57) ABSTRACT

A dual-output current driver includes a pair of output stages that provide output current to various devices such as LEDs and laser diodes. An output-stage selector circuit that includes a differential pair is arranged to activate one of the output stages at a time. A pair of push-pull circuits may be employed to drive the differential pair such that high speed switching is possible. A single-ended to differential conversion circuit controls the push-pull circuits. The selected output stage receives a drive current from a differential pair circuit in a current driver circuit. The current driver circuit includes another pair of push-pull circuits that drive its differential pair circuit, and one or more additional differential circuits that are arranged to activate the push-pull circuits. The various differential pair circuits in the current driver circuit can be arranged to provide phase reversal, or modulation of the drive current in the output stages.

22 Claims, 7 Drawing Sheets

DUAL-OUTPUT CURRENT DRIVER

FIELD OF THE INVENTION

The present invention is generally related to a programmable charge-pump circuit. More particularly, the present invention is related to a charge-pump circuit with reduced charge injection characteristics from switching at the output of the charge-pump circuit, and reduced slewing in the charge-pump such that high speed operation is possible.

BACKGROUND OF THE INVENTION

Optical disk technology is commonly used for storage of video, audio, and other digitally formatted information. A typical optical disk player system includes a combination of mechanical, optical, and electrical systems. The mechanical system is configured to clamp the disk in place and rotate the disk at a desired speed. The optical system is configured to retrieve the stored information from the rotating disk. The electrical system cooperates with the mechanical system to control disk loading and rotation. The electrical system also cooperates with the optical system to control detection and conversion of retrieved optical information to an electronic signal.

A compact disk (CD) is one type of optical disk that is used to store information. A typical CD consists of a transparent polycarbonate substrate that is covered by a reflective material, which in turn is covered by a protective layer. The substrate permits light to penetrate to the reflective layer. Information is stored in the reflective layer as a series of depressions or pits. The depressions in typical optical disks are between 110 and 130 nm in depth. The reflective layer is used to create a diffraction structure such that incident light of a given wavelength undergoes destructive interference. The interference decreases the intensity of reflected light at a predetermined distance that is a quarter wavelength of the incident light. The presence of pits in the surface of the reflective material are detected by photo-detectors in terms of the change in light intensity between the incident and reflected light. The length of the pits in a typical CD is approximately 830 nm.

A digital video disk (DVD is another type of optical disk that is used to store information. The DVD is similar in construction to a CD. However, a DVD can store information in up to four different reflective layers. Two of the reflective layers are on one side of the DVD, while the other two reflective layers are on the other side of the DVD. On each side of the disk, the second reflective layer is beneath the first reflective layer. As in CD technology, pits in the reflective layers are used to store information. The light source can be focused on either the first layer or the second layer. A photo-detector detects the presence of pits in the surface of the reflective layers by detecting the changes in light intensity between the incident and reflected light from the various reflective layers. The length of the pits in a typical DVD is approximately 400 nm, which is roughly half the length of pits in a typical CD. The typical storage capacity of a CD is around 700 MB, while a DVD can store about 4.38 GB for a single-sided/single-layer DVD, 7.95 GB for a single-sided/double-layer, 8.75 GB for a double-sided/single-layer DVD, and 15.9 GB for a double-sided/double-layer DVD.

A typical incident light source that is used in an optical disk system is a laser diode. The laser diode is located adjacent the surface of the disk, and focused at the surface of the reflective layer in the disk. In some instances, two different laser diodes are used in the same system. For example, some DVD players employ two laser diodes, where one laser diode is focused at one depth for reading DVDs, and another laser diode is focused at another depth for reading CDs.

SUMMARY OF THE INVENTION

The present invention is related to dual-output current drivers. A dual-output current driver may provide an output current to either a first output or a second output. A first output stage is configured to drive a first current to the first output when enabled. A second output stage that is configured to drive a second current to the second output when enabled. A first switching circuit is configured to disable the first output stage when active. A second switching circuit is configured to disable the second output stage when active. An output stage selector circuit includes a first differential pair, wherein a first portion of the first differential pair is coupled to the first switching circuit and a second portion of the first differential pair is coupled to the second switching circuit such that the first differential pair selectively activates one of the first and second switching circuits.

In one example of the present invention, the first and second output stages may each include a first and second transistor that are arranged to operate as a current mirror, where each first transistor is coupled to a respective one of the first and second switching circuits, and where each second transistor is coupled to a respective one of the first and second outputs. The first and second switching circuits may each include a third transistor that is configured to couple the first transistor of the respective output stage to a power supply such that the first transistor is inactive and the output stage is disabled.

In another example of the present invention, the output stage selector includes a first push-pull circuit that is arranged to provide a first portion of a differential signal to a first input of the first differential pair in response to a first control signal, and a second push-pull circuit that is arranged to provide a second portion of the differential signal to a second input of the first differential pair in response to a second control signal. The first push-pull circuit may include a first pair of transistors that are commonly controlled by the first control signal. The second push-pull circuit may include a second pair of transistors that are commonly controlled by the second control signal.

In still another example, the output stage selector may further include a singled-ended to differential conversion circuit that is arranged to provide the first input signal and the second input signal in response to a reference signal and a selector signal. The single-ended to differential conversion circuit may include a second differential pair that is configured to provide the first and second control signals in response to a selector control signal and a reference control signal.

In yet another example, the single-ended to differential conversion circuit may further include a first follower circuit, a second follower circuit, a first level shifter circuit, a second level shifter circuit, and a third level shifter circuit. The first level shifter circuit is arranged to provide a first portion of a second differential signal to the second differential pair in response to a first intermediate signal. The second follower circuit is arranged to provide a second portion of the second differential signal to the second differential pair in response to a second intermediate signal. The first level shifter circuit is arranged to provide the first intermediate signal in response to the selector control signal.

The second level shifter circuit is arranged to limit the signal level of the first intermediate signal. The third level-shifter circuit is arranged to provide the second intermediate signal in response to the reference control signal.

In another example, the dual-output current driver includes a current driver circuit that includes a third differential pair. The third differential pair is arranged to selectively steer a drive current to one of the first and second output stages. The current driver circuit may further include a first push-pull circuit that is configured to provide a first portion of a differential signal to a first input of the third differential pair in response to a first control signal, and a second push-pull circuit that is arranged to provide a second portion of the differential signal to a second input of the third differential pair in response to a second control signal. The current driver circuit may also include a current selector circuit that is configured to provide the first and second control signals.

In one example, the current selector includes fourth and fifth differential pair circuits. The fourth differential pair circuit includes a fourth differential pair and a fourth current source, while the fifth differential pair circuit includes a fifth differential pair and a fifth current source. The fourth and fifth differential pairs are commonly controlled such that the fourth current source is inactive when the fifth current source is active, and the fifth current source is inactive when the fourth current source is active. The fourth and fifth differential pair circuits are arranged such that the phase associated with the drive current is reversed by selective activation of the fourth and fifth current sources. The current selector circuit may further include a sixth differential pair circuit. The sixth differential pair circuit includes a sixth differential pair and a sixth current source. The sixth differential pair is controlled by a differential oscillator signal such that the fourth and fifth current sources are inactive when the sixth current source is active, and the sixth current source is inactive when either of the fourth and fifth current sources is active. The sixth differential pair circuit is arranged such that the drive current is modulated when the sixth current source is active.

In another example, the current selector circuit includes a sixth differential pair circuit (without the fourth and fifth differential pair circuits). The sixth differential pair circuit includes a sixth differential pair and a sixth current source. The sixth differential pair is controlled by a differential oscillator signal such that the drive current is modulated when the sixth current source is active.

In still another example, the current selector circuit may include a first level shifter circuit, a second level shifter circuit, and a fourth differential pair circuit. The first level shifter circuit is configured to drive a first input of a fourth differential pair circuit in response to an EN signal. The second level shifter circuit is configured to drive a second input of the fourth differential pair circuit in response to an ENB signal. The fourth differential pair circuit provides the first and second control signals in response to the EN and ENB signals.

Another dual-output current driver may provide an output current to either a first output or a second output. A first output stage is configured to drive a first current to a first output when enabled. A second output stage is configured to drive a second current to a second output when enabled. A current driver circuit includes a first differential pair and a first current source, where the first differential pair is arranged to selectively steer a drive current from the first current source to one of the first and second output stages. The current driver circuit may further include a first push-pull circuit, and a second push-pull circuit. The first push-pull circuit is configured to provide a first portion of a differential signal to a first input of the first differential pair in response to a first control signal. The second push-pull circuit is arranged to provide a second portion of the differential signal to a second input of the first differential pair in response to a second control signal. The dual-output current driver circuit may further include a current selector circuit that is configured to provide the first and second control signals. The current selector circuit may further include a second differential pair circuit. The second differential pair circuit includes a second differential pair and a second current source, wherein the second differential pair is controlled by a differential oscillator signal such that the drive current is modulated when the second current source is active. The current selector circuit may also include a third differential pair circuit and a fourth differential pair circuit. The third differential pair circuit includes a third differential pair and a third current source. The fourth differential pair circuit includes a fourth differential pair and a fourth current source. The third and fourth differential pairs are commonly controlled. The third current source is inactive when the fourth current source is active, and the fourth current source is inactive when the third current source is active. The third and fourth differential pair circuits are arranged such that the phase associated with the drive current is reversed by selective activation of the third and fourth current sources.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention relates to a driver circuit for light sources such as those found in an optical disk player system.

The driver circuit includes a pair of current driver outputs that are configured to provide current to one of two light sources. The light sources may be laser diode devices, or some other diode type of device that emits light when activated by current. The driver circuit corrects the output drive for proper signal phase. The dual-output driver circuit may be implemented in a single integrated circuit.

Briefly stated, a dual-output current driver includes a pair of output stages that provide output current to various devices such as LEDs and laser diodes. An output-stage selector circuit that includes a differential pair is arranged to activate one of the output stages at a time. A pair of push-pull circuits may be employed to drive the differential pair such that high speed switching is possible. A single-ended to differential conversion circuit controls the push-pull circuits. The selected output stage receives a drive current from a differential pair circuit in a current driver circuit. The current driver circuit includes another pair of push-pull circuits that drive its differential pair circuit, and one or more additional differential circuits that are arranged to activate the push-pull circuits. The various differential pair circuits in the current driver circuit can be arranged to provide phase reversal, or modulation of the drive current in the output stages.

The above-described features, as well as others, will be described below with reference to the accompanying drawings.

Exemplary Dual-Output Current Driver

Figure 1:
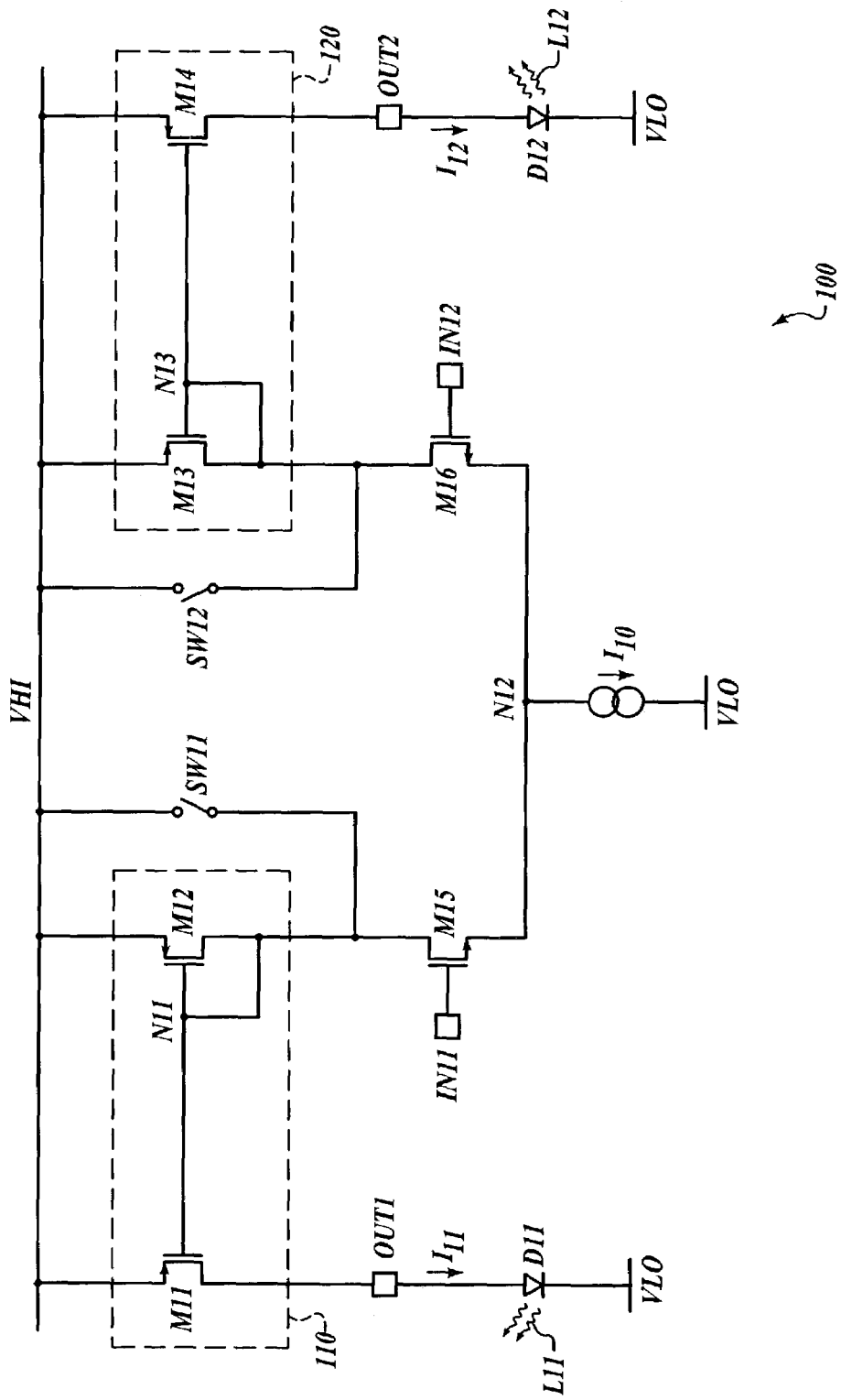
FIG. 1 is a schematic diagram of an exemplary dual-output current driver circuit.

FIG. 1 is a schematic diagram of an exemplary dual-output current driver circuit (100) that is arranged in accordance with the present invention. The dual-output driver circuit (100) includes transistors M11–M16, switching circuits SW11–SW12, and current source I10.

Transistor M11 includes a source that is coupled to VHI, a gate that is coupled to node N11, and a drain that is coupled to a first output (OUT1). Transistor M12 includes a source that is coupled to VHI, and a gate and drain that is coupled to node N11. Transistor M13 includes a source that is coupled to VHI, and a gate and drain that are coupled to node N13. Transistor M14 includes a source that is coupled to VHI, a gate that is coupled to node N13, and a drain that is coupled to a second output (OUT2). Transistor M15 includes a source that is coupled to node N12, a gate that is coupled to a first input (IN11), and a drain that is coupled to node N11. Transistor M16 includes a source that is coupled to node N12, a gate that is coupled to a second input (IN12), and a drain that is coupled to node N13. Current source I10 is coupled to node N12. Switching circuit SW11 is coupled between VHI and node N11, while switching circuit SW12 is coupled between VHI and node N13.

Transistors M15 and M16 are arranged to operate as a differential pair that is coupled to a common current source (I10). An input signal is applied across IN11 and IN12 to selectively steer current from current source I10 through one of the transistors in the differential pair.

Transistor M11 and M12 form a first output stage (110), while transistors M13 and M14 form a second output stage (120). Each output stage is configured to drive current to a respective output. Each of the output stages provides gain that is determined by the ratio of the transistor sizes of transistors M11; M12, and M13; M14, respectively. For example, transistors M11 and M12 are arranged to operate as a current mirror when active such that the ratio of their sizes determines the gain associated with output stage 110. Similarly, transistors M13 and M14 are also arranged to operate as a current mirror when active such that the ratio of their sizes determines the gain associated with output stage 120.

In operation, switching circuits SW11 and SW12 are operated out of phase with one-another. In other words, switching circuit SW11 is activated when switching circuit SW12 is deactivated, and vice-versa. Dual-output driver circuit 100 is configured to provide a first output current (I11) to the first output node (OUT1) when switching circuit SW11 is deactivated and switching circuit SW12 is activated. Dual-output driver circuit 100 is also configured to provide a second output current (I12) to the second output node (OUT2) when switching circuit SW11 is activated and switching circuit SW12 is deactivated. While switching circuit SW11 is activated, the first output stage is disabled (e.g., the gate and source of transistor M12 are shorted together) and current is steered through transistor M16 to the second output stage. While switching circuit SW12 is activated, the second output stage is disabled and current is steered through transistor M15 to the second output stage.

Diode circuit D11 is coupled to the first output (OUT1) such that the diode circuit is activated when the first output current (I11) is active. Similarly, diode circuit D12 is coupled to the second output (OUT2) such that the diode circuit is activated when the second output current (I12) is active. Diode circuits D11 and D12 may be light emitting diode circuits such as LEDs, or laser-diodes, which emit light (e.g., L11 or L12) when activated. In one example, diode circuit D11 is a laser-diode in a CD system and diode circuit D12 is a laser-diode in a DVD system.

Figure 2:
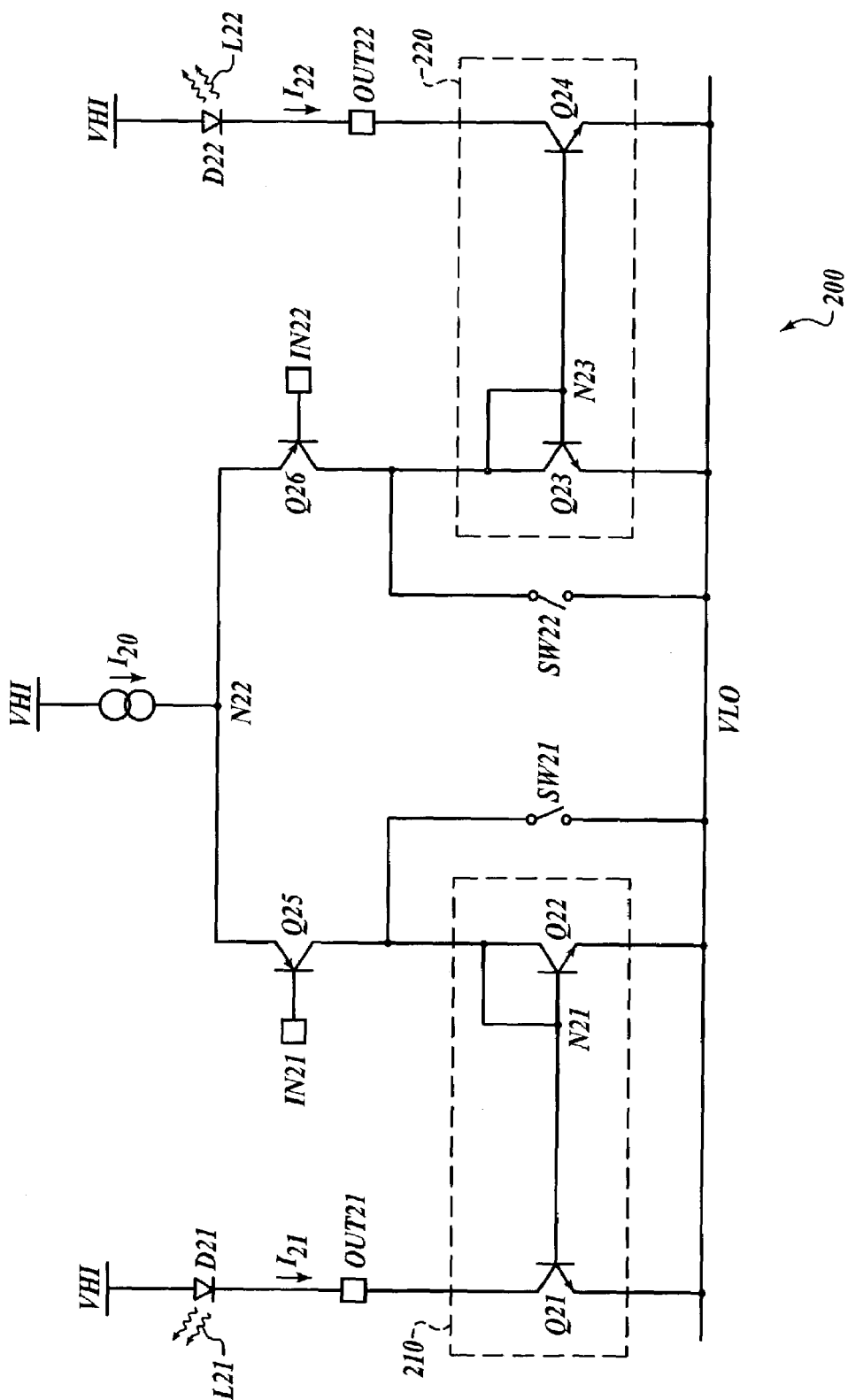
FIG. 2 is a schematic diagram of another exemplary dual-output current driver circuit.

The transistors illustrated in FIG. 1 are field effect transistors (FETs) such as metal-oxide semiconductor (MOS) devices. However, the same circuit configuration is equally applicable for bipolar junction transistors (BJTs). Another example that includes a BJT implementation is illustrated in FIG. 2. Other example circuits that perform the functions described above are considered within the scope of the present invention.

Another Exemplary Dual-Output Current Driver

FIG. 2 is a schematic diagram of another exemplary dual-output current driver circuit (200) that is arranged in accordance with the present invention. The dual-output driver circuit (200) includes transistors Q21–Q26, switching circuits SW21–SW22, and current source I20.

Transistor Q21 includes an emitter that is coupled to VLO, a base that is coupled to node N21, and a collector that is coupled to a first output (OUT21). Transistor Q22 includes an emitter that is coupled to VLO, and a base and collector that are coupled to node N21. Transistor Q23 includes an emitter that is coupled to VLO, and a base and collector that are coupled to node N23. Transistor Q24 includes an emitter that is coupled to VLO, a base that is coupled to node N23, and a collector that is coupled to a second output (OUT22). Transistor Q25 includes an emitter that is coupled to node N22, a base that is coupled to a first input (IN21), and a collector that is coupled to node N21. Transistor Q26 includes an emitter that is coupled to node N22, a base that is coupled to a second input (IN22), and a collector that is coupled to node N23. Current source I20 is coupled to node N22. Switching circuit SW21 is coupled between VLO and node N21, while switching circuit SW22 is coupled between VLO and node N23.

Transistors Q25 and Q26 are arranged to operate as a differential pair that is coupled to a common current source (I20). An input signal is applied across IN21 and IN22 to selectively steer current from current source I20 through one of the transistors in the differential pair.

Transistor Q21 and Q22 form a first output stage, while transistors Q23 and Q24 form a second output stage. Each output stage is configured to drive current to a respective output. Each of the output stages provides gain that is determined by the ratio of the transistor sizes of transistors Q21; Q22, and Q23; Q24, respectively. For example, transistors Q21 and Q22 are arranged to operate as a current mirror when active such that the ratio of their sizes determines the gain associated with output stage 210. Similarly, transistors Q23 and Q24 are also arranged to operate as a current mirror when active such that the ratio of their sizes determines the gain associated with output stage 220.

In operation, switching circuits SW21 and SW22 are operated out of phase with one-another. In other words, switching circuit SW21 is activated when switching circuit SW22 is deactivated, and vice-versa. Dual-output driver circuit 200 is configured to provide a first output current (I21) to the first output (OUT21) when switching circuit SW21 is deactivated and switching circuit SW22 is activated. Dual-output driver circuit 200 is also configured to provide a second output current (I22) to the second output (OUT22) when switching circuit SW21 is activated and switching circuit SW22 is deactivated. While switching circuit SW21 is activated, the first output stage is disabled (e.g., the base and emitter of transistor Q22 are shorted together) and current is steered through transistor Q26 to the second output stage. While switching circuit SW22 is activated, the second output stage is disabled and current is steered through transistor Q25 to the second output stage.

Diode circuit D21 is coupled to the first output (OUT21) such that the diode circuit is activated when the first output current (I21) is active. Similarly, diode circuit D22 is coupled to the second output (OUT22) such that the diode circuit is activated when the second output current (I22) is active. Diode circuits D21 and D22 may be light emitting diode circuits such as LEDs, or laser-diodes, which emit light (e.g., L21 or L22) when activated. In one example, diode circuit D21 is a laser-diode in a CD system and diode circuit D22 is a laser-diode in a DVD system.

The transistors illustrated in FIG. 2 are BJTs. However, the same circuit configuration is equally applicable for FETs. Other example circuits that perform the functions described above are considered within the scope of the present invention.

Exemplary Switching Circuits

Figure 3:
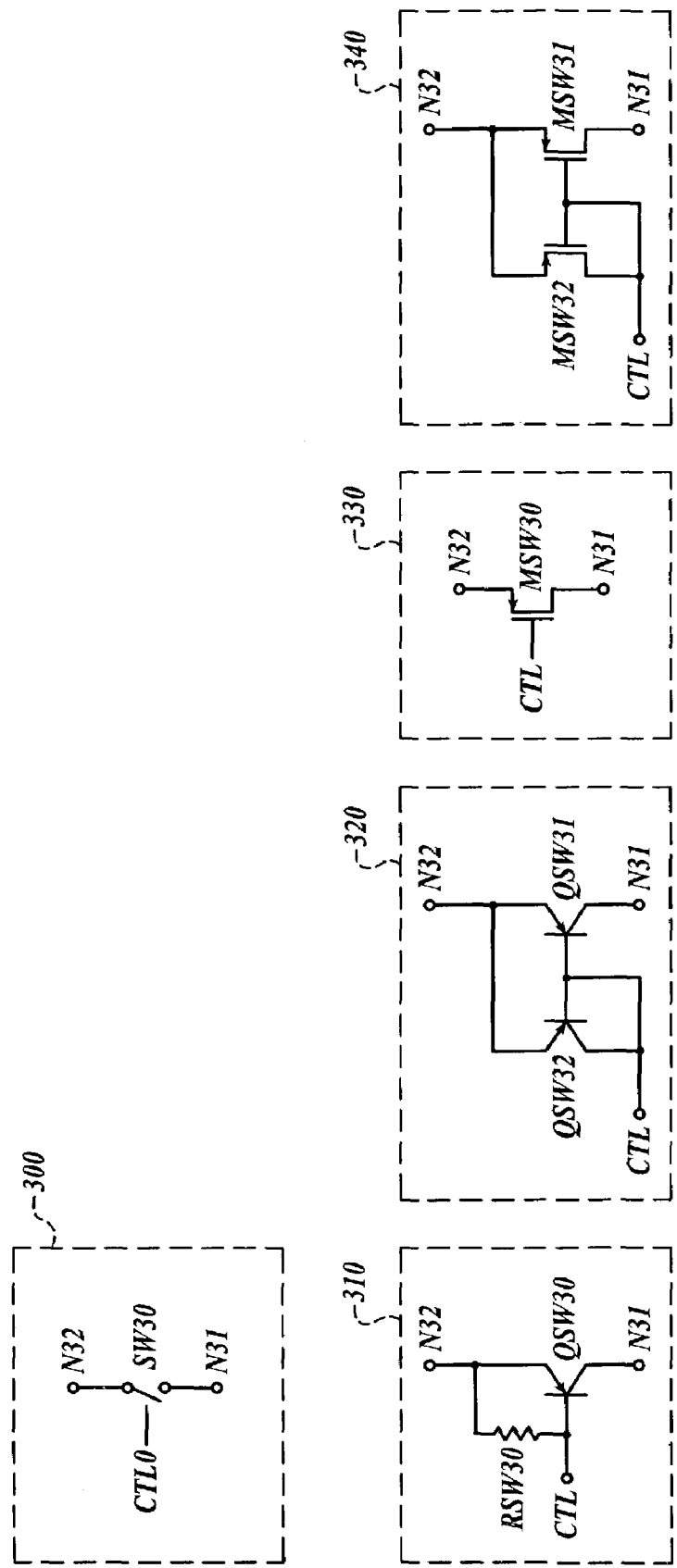
FIG. 3 is a schematic diagram of exemplary switching circuits.

FIG. 3 is a schematic diagram of exemplary switching circuits (300, 310, 320, 330, 340) that are arranged in accordance with the present invention.

The first switching circuit (300) is an ideal switching circuit, which includes a switch that is actuated in response to a control signal (CTL). The switch couples node N31 and N32 together when the switching circuit is activated, and isolates nodes N31 and N32 when the switching circuit is deactivated. Switching circuits 310–340 are similarly labeled.

The second switching circuit (310) includes a transistor QSW30, and a resistor (RSW30). Resistor RSW30 is coupled between the base and emitter of transistor QSW30. Control signal CTL activates transistor QSW30 such that node N31 and N32 are coupled together when the transistor QSW30 is activated, and isolates nodes N31 and N32 when the transistor QSW30 is deactivated.

The third switching circuit (320) includes two transistors (QSW31, QSW32). Transistor QSW32 includes an emitter that is coupled to node N32, and a base and collector that are coupled to CTL. Transistor QSW31 includes and emitter that is coupled to node N32, a base that is coupled to CTL, and a collector that is coupled to node N31. Control signal CTL activates transistor QSW32, which in turn activates transistor QSW31 such that node N31 and N32 are coupled together when the transistor QSW31 is activated, and isolates nodes N31 and N32 when the transistor QSW31 is deactivated.

The fourth switching circuit (330) comprises a transistor (MSW30), which includes a source that is coupled to node N32, a gate that is coupled to CTL, and a drain that is coupled to node N31. Control signal CTL activates transistor MSW30 such that node N31 and N32 are coupled together when the transistor MSW30 is activated, and isolates nodes N31 and N32 when the transistor MSW30 is deactivated.

The fifth switching circuit (340) includes a first transistor (MSW31) and a second transistor (MSW32). Transistor MSW31 includes a source that is coupled to node N32, a gate that is coupled to CTL, and a drain that is coupled to node N31. Transistor MSW32 includes a source that is coupled to node N32, and a gate and drain that is coupled to CTL. Control signal CTL activates transistor MSW32, which in turn activates transistor MSW31 such that node N31 and N32 are coupled together when the transistor MSW31 is activated, and isolates nodes N31 and N32 when the transistor MSW31 is deactivated.

Switching circuits 310–320 illustrate exemplary BJT switching circuits, while switching circuits 330–340 illustrate exemplary FET switching circuits. Other voltage-controlled current source (VCCS), current-controlled current source (CCCS), voltage-controlled voltage source (VCVS), and current-controlled voltage source (CCVS) circuits may be employed without departing from the spirit of the present invention.

Exemplary High-Speed Dual-Output Driver Selector

Figure 4:
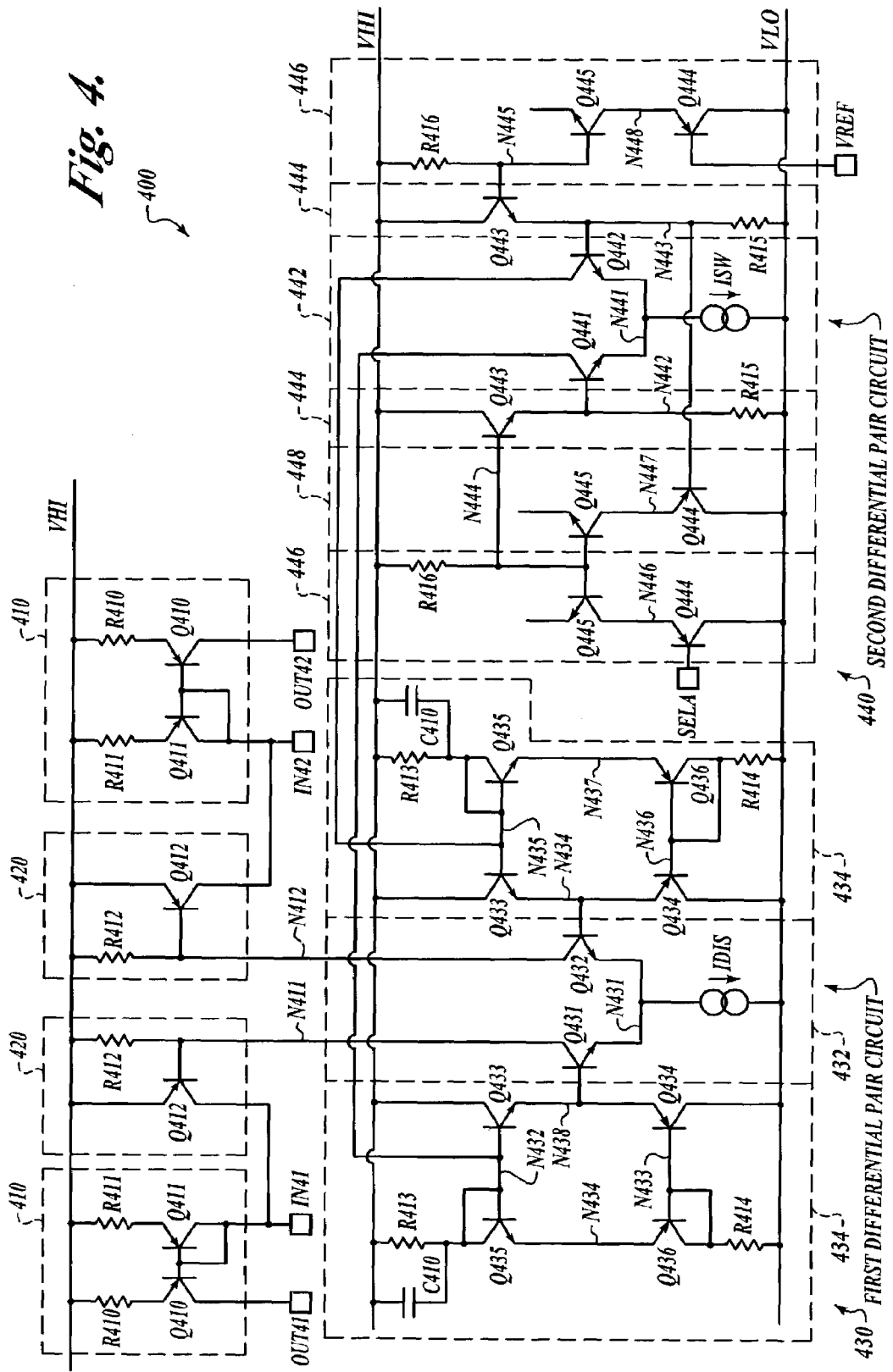
FIG. 4 is a schematic diagram of an exemplary high-speed dual-output current driver selector circuit.

FIG. 4 is a schematic diagram of an exemplary high-speed dual-output current driver selector circuit (400) that is arranged in accordance with the present invention. The high-speed dual-output current driver selector circuit (400) includes two output stages (410), two switching circuits (420), a differential current switching circuit (430), and a single-ended to differential conversion circuit (440). The differential current switching circuit (430) includes a differential pair circuit (432), and two push-pull circuits (434). The single-ended to differential conversion circuit (440) includes another differential pair circuit (442), two emitter-follower circuits (444), and three level-shifter circuits (446, 446, 448).

The first output stage (410) includes two transistors (Q410, Q411), and two resistors (R410, R411). Transistor Q410 includes an emitter that is coupled to VHI through resistor R410, a base that is coupled to IN41, and a collector that is coupled to OUT41. Transistor Q411 includes an emitter that is coupled to VHI through resistor R411, and a base and collector that are coupled to IN41. Similar to the output stages described in FIGS. 1 and 2, transistors Q410 and Q411 are configured as a current mirror where the ratio of the sizes of transistors Q410 and Q411 determines the gain that is associated with the current mirror. In operation, a current source is coupled to IN41, and OUT41 serves as an output that is coupled to a device such as a laser-diode.

The second output stage (410) also includes two transistors (Q410, Q411), and two resistors (R410, R411). Transistor Q410 includes an emitter that is coupled to VHI through resistor R410, a base that is coupled to IN42, and a collector that is coupled to OUT42. Transistor Q411 includes an emitter that is coupled to VHI through resistor R411, and a base and collector that are coupled to IN42. Similar to the output stages described in FIGS. 1 and 2, transistors Q410 and Q411 are configured as a current mirror where the ratio of the sizes of transistors Q410 and Q411 determines the gain that is associated with the current mirror. In operation, a current source is coupled to IN42, and OUT42 serves as an output that is coupled to a device such as a laser-diode.

The first switching circuit (420) includes a transistor (Q412), and a resistor (R412). Transistor 420 includes an emitter that is coupled to VHI, a base that is coupled to node N411, and a collector that is coupled to IN41. Resistor R412 is coupled between node N411 and VHI. In operation, the first switching circuit is configured to disable the first output stage in response to a signal at node N411. For example, the first switching circuit is activated when the disable current (IDIS) is coupled to resistor R412 such that transistor Q412 is forward biased. While active, transistor Q412 couples the base and emitter of transistor Q411 together such that the first output stage is disabled.

The second switching circuit (420) includes a transistor (Q412) and a resistor (R412). Transistor 420 includes an emitter that is coupled to VHI, a base that is coupled to node N412, and a collector that is coupled to IN42. Resistor R412 is coupled between node N412 and VHI. In operation, the second switching circuit is configured to disable the second output stage in response to a signal at node N412. For example, the second switching circuit is activated when the disable current (IDIS) is coupled to resistor R412 such that transistor Q412 is forward biased. While active, transistor Q412 couples the base and emitter of transistor Q411 together such that the second output stage is disabled.

Differential pair circuit 432 includes a pair of transistors (Q431, Q432), and a current source (IDIS). Transistor Q431 includes an emitter that is coupled to node N431, a base that is coupled to node N438, and a collector that is coupled to node N411. Transistor Q432 includes an emitter that is coupled to node N431, a base that is coupled to node N439, and a collector that is coupled to node N412. The current source (IDIS) is coupled between nodes N431 and VLO. In operation, the differential pair circuit (432) is configured to steer the disable current (IDIS) to node N411 and node N412 in response to a differential signal that is applied between across nodes N438 and N439.

The first push-pull circuit (434) includes four transistors (Q433–Q436), two resistors (R413, R414), and a capacitor (C410). Transistor Q433 includes an emitter that is coupled to node N438, a base that is coupled to node N432, and a collector that is coupled to VHI. Transistor Q434 includes an emitter that is coupled to node N438, a base that is coupled to node N433, and a collector that is coupled to VLO. Transistor Q435 includes an emitter that is coupled to node N434, and a base and collector that are coupled to node N432. Transistor Q436 includes an emitter that is coupled to node N434, and a base and collector that are coupled to node N433. Resistor R413 is coupled between node N432 and VHI. Resistor R414 is coupled between node N433 and VLO. Capacitor C410 is coupled between node N432 and VHI. In operation, the first push-pull circuit (434) is arranged to provide a control signal at node N438 in response to a signal at node N432. For example, when current is drawn through resistor R413 from node N432, the base voltage associated with transistor Q433 drops, which in turn decreases the voltage at node N438. Similarly, transistor Q433 is forward biased when no current is drawn from node N432 such that the voltage at node N438 increases. Capacitor C410 provides filtering of various switching transients in the push-pull circuit.

The second push-pull circuit (434) includes four transistors (Q433–Q436), two resistors (R413, R414), and a capacitor (C410). Transistor Q433 includes an emitter that is coupled to node N439, a base that is coupled to node N435, and a collector that is coupled to VHI. Transistor Q434 includes an emitter that is coupled to node N439, a base that is coupled to node N436, and a collector that is coupled to VLO. Transistor Q435 includes an emitter that is coupled to node N437, and a base and collector that are coupled to node N435. Transistor Q436 includes an emitter that is coupled to node N437, and a base and collector that are coupled to node N436. Resistor R413 is coupled between node N435 and VHI. Resistor R414 is coupled between node N436 and VLO. Capacitor C410 is coupled between node N435 and VHI. In operation, the second push-pull circuit (434) is arranged to provide a control signal at node N439 in response to a signal at node N435. For example, when current is drawn through resistor R413 from node N435, the base voltage associated with transistor Q433 drops, which in turn decreases the voltage at node N439. Similarly, transistor Q433 is forward biased when no current is drawn from node N435 such that the voltage at node N439 increases. Capacitor C410 provides filtering of various switching transients in the push-pull circuit.

The other differential pair circuit (442) includes another pair of transistors (Q441, Q442), and another current source (ISW). Transistor Q441 includes an emitter that is coupled to node N441, a base that is coupled to node N442, and a collector that is coupled to node N432. Transistor Q442 includes an emitter that is coupled to node N441, a base that is coupled to node N443, and a collector that is coupled to node N435. The other current source (ISW) is coupled between nodes N441 and VLO. The differential pair circuit (442) is configured to steer the ISW current to node N432 and node N435 in response to a differential signal that is applied between node N442 and node N443.

The first emitter-follower circuit (444) includes a transistor (Q443), and a resistor (R415). Transistor Q443 includes an emitter that is coupled to VLO through resistor R415, a base that is coupled to node N444, and a collector that is coupled to VHI. The first emitter-follower circuit (444) is configured to provide a signal at node N442 in response to a signal at node N444.

The second emitter-follower circuit (444) also includes a transistor (Q443), and a resistor (R415). Transistor Q443 includes an emitter that is coupled to VLO through resistor R415, a base that is coupled to node N445, and a collector that is coupled to VHI. The second emitter-follower circuit (444) is configured to provide a signal at node N443 in response to a signal at node N445.

The first level-shifter circuit (446) includes two transistors (Q444, Q445), and a resistor (R416). Transistor Q445 includes a base that is coupled to node N444, and a collector that is coupled to node N446. Transistor Q444 includes an emitter that is coupled to node N446, a base that is coupled to SELA, and a collector that is coupled to VLO. Resistor R416 is coupled between node N444 and VHI. The base-collector diode in transistor Q445 is configured to operate as a breakdown protection circuit. The first level-shifter circuit (446) is configured to provide a signal at node N444 in response to a SELA signal (note: this assumes that transistors Q444 and Q445 do not interfere with the first level-shifter).

The second level-shifter circuit (448) also includes two transistors (Q444, Q445), and shares resistor (R416) with the first level-shifter circuit (446). Transistor Q445 includes a base that is coupled to node N444, and a collector that is coupled to node N447. Transistor Q444 includes an emitter that is coupled to node N447, a base that is coupled to node N443, and a collector that is coupled to VLO. The base-collector diode in transistor Q445 is again configured to operate as a breakdown protection circuit. The second level-shifter circuit (448) is also arranged to provide a signal at node N444 in response to a signal at node N443. As will be described later, the second level-shifter circuit (448) is also arranged to limit the voltage associated with node N444 as determined by the VREF signal.

The third level-shifter circuit (446) also includes two transistors (Q444, Q445), and a resistor (R416). Transistor Q445 includes a base that is coupled to node N445, and a collector that is coupled to node N448. Transistor Q444 includes an emitter that is coupled to node N448, a base that is coupled to VREF, and a collector that is coupled to VLO. Resistor R416 is coupled between node N445 and VHI. The base-collector diode in transistor Q445 is again configured to operate as a breakdown protection circuit. The third level-shifter circuit (448) is arranged to provide a signal at node N445 in response to a VREF signal.

In operation, the SELA signal operates as a selector control signal and the VREF signal operates as a reference control signal to the single-ended to differential conversion circuit (440). The signal at node N443 is determined by the VREF signal. The signal at node N442 is a limited signal that is predominately determined by the SELA signal. The limit to the signal at node N442 is approximately equal to a diode voltage above the base voltage associated with transistor Q443 in the third level-shifter circuit.

The transistors illustrated in FIG. 4 are BJTs. However, the same circuit configuration is equally applicable for FETs. Other example circuits that perform the functions described above are considered within the scope of the present invention.

Exemplary Selectable Current Switch Circuit

Figure 5:
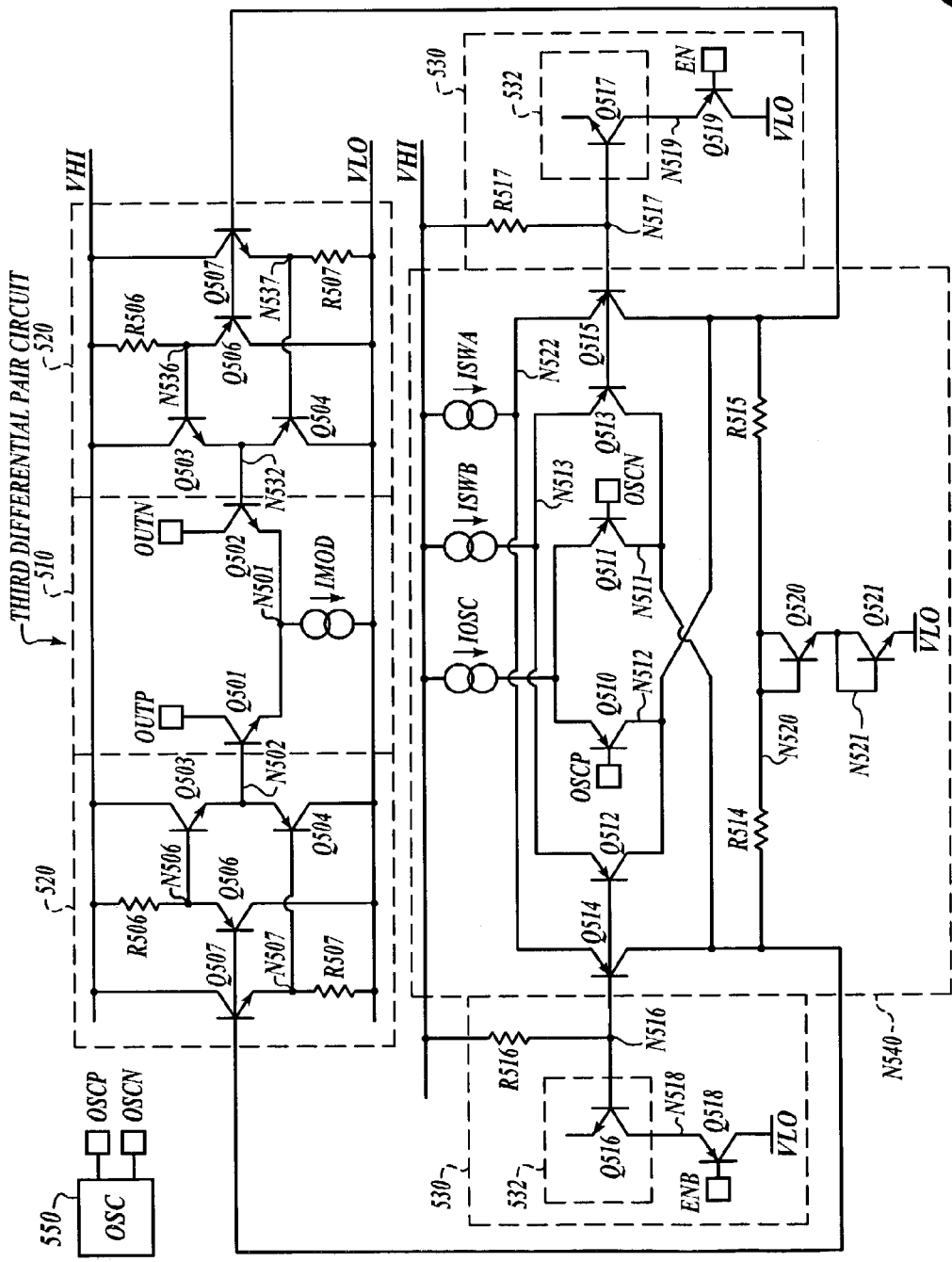
FIG. 5 is a schematic diagram of an exemplary modulating dual-output current driver circuit.

FIG. 5 is a schematic diagram of an exemplary modulating dual-output current driver circuit (500), which is arranged in accordance with the present invention. The modulating dual-output current driver circuit includes a differential pair circuit (510), two push-pull stages (520), two level-shifter circuits (530), and a current selector circuit (540).

Differential pair circuit 510 includes two transistors (Q501, Q502), and a current source (IMOD). Transistor Q501 includes an emitter that is coupled to node N501, a base that is coupled to node N502, and a collector that is coupled to OUTP. Transistor Q502 includes an emitter that is coupled to node N501, a base that is coupled to node N532, and a collector that is coupled to OUTN. Current source IMOD is coupled between node N501 and VLO. In operation, the differential pair circuit (510) is configured to operate as a current switch that steers a drive current (IMOD) to OUTP and OUTN in response to a differential signal that is applied between across node N502 and node N532. The drive current (IMOD) is DC coupled to the output stages via OUTP and OUTN. In one example, OUTP is coupled to IN41 and OUTN is coupled to IN42 of FIG. 4.

The parasitic capacitances at the base of transistors Q501 and Q502 impede the switching speeds of IMOD between OUTP and OUTN. The two push-pull circuits are arranged to drive the base of transistors Q501 and Q502 such that large IMOD currents can be switched at high speeds (e.g., less than 1 ns).

The first push-pull circuit (520) includes four transistors (Q503, Q504, Q506, Q507) and two resistors (R506, R507). Transistor Q503 includes an emitter that is coupled to node N502, a base that is coupled to node N506, and a collector that is coupled to VHI. Transistor Q504 includes an emitter that is coupled to node N502, a base that is coupled to node N507, and a collector that is coupled to VLO. Transistor Q506 includes an emitter that is coupled to node N506, a base that is coupled to node N511, and a collector that is coupled to VLO. Transistor Q507 includes an emitter that is coupled to node N507, a base that is coupled to node N511, and a collector that is coupled to VHI.

The second push-pull circuit (520) includes four transistors (Q503, Q504, Q506, Q507) and two resistors (R506, R507). Transistor Q503 includes an emitter that is coupled to node N532, a base that is coupled to node N536, and a collector that is coupled to VHI. Transistor Q504 includes an emitter that is coupled to node N532, a base that is coupled to node N537, and a collector that is coupled to VLO. Transistor Q506 includes an emitter that is coupled to node N536, a base that is coupled to node N512, and a collector that is coupled to VLO. Transistor Q507 includes an emitter that is coupled to node N537, a base that is coupled to node N512, and a collector that is coupled to VHI.

The first push-pull circuit (520) is configured to provide a signal at node N502 in response to a signal at node N511. Similarly, the second push-pull circuit (520) is configured to provide a signal at node N532 in response to a signal at node N512. The push-pull circuits are operable over a limited common-mode range such that the signal levels associated with nodes N511 and N512 should be maintained at nearly constant levels for consistent switching speeds. The two level-shifter circuits (530), and the current selector circuit (540) are arranged to operate as an input stage that maintains relatively constant common-mode levels for the push-pull circuits.

The first level-shifter circuit (530) includes two transistors (Q516, Q518), and a resistor (R516). Transistor Q516 includes a base that is coupled to node N516, and a collector that is coupled to node N518. Transistor Q518 includes an emitter that is coupled to node N518, a base that is coupled to ENB, and a collector that is coupled to VLO. Resistor R516 is coupled between node N516 and VHI. In operation, the first level-shifter circuit (530) is arranged to provide a signal at node N516 in response to the ENB signal. For example, a low ENB signal activates (forward-biases) transistor Q518 such that a voltage drop develops across resistor R516, while a high ENB signal deactivates (reverse-biases) transistor Q518. The base-collector diode of transistor Q516 is arranged to provide breakdown protection to the first level-shifter circuit.

The second level-shifter circuit (530) also includes two transistors (Q517, Q519), and a resistor (R517). Transistor Q517 includes a base that is coupled to node N517, and a collector that is coupled to node N519. Transistor Q519 includes an emitter that is coupled to node N519, a base that is coupled to EN, and a collector that is coupled to VLO. Resistor R517 is coupled between node N517 and VHI. In operation, the second level-shifter circuit (530) is arranged to provide a signal at node N517 in response to the EN signal. For example, a low EN signal activates (forward-biases) transistor Q518 such that a voltage drop develops across resistor R517, while a high EN signal deactivates (reverse-biases) transistor Q518. The base-collector diode of transistor Q516 is arranged to provide breakdown protection to the second level-shifter circuit.

Current selector circuit 540 includes eight transistors (Q510–Q515, Q520, Q521), three current sources (IOSC, ISWA, ISWB), and two resistors (R514, R515). Transistor Q510 includes an emitter that is coupled to node N510, a base that is coupled to OSCP, and a collector that is coupled to node N512. Transistor Q511 includes an emitter that is coupled to node N510, a base that is coupled to OSCN, and a collector that is coupled to node N511. Transistor Q512 includes an emitter that is coupled to node N513, a base that is coupled to node N516, and a collector that is coupled to node N512. Transistor Q513 includes an emitter that is coupled to node N513, a base that is coupled to node N517, and a collector that is coupled to node N511. Transistor Q514 includes an emitter that is coupled to node N522, a base that is coupled to node N516, and a collector that is coupled to node N511. Transistor Q515 includes an emitter that is coupled to node N522, a base that is coupled to node N517, and a collector that is coupled to node N512. Transistor Q520 includes an emitter that is coupled to node N521, and a base and collector that are coupled to node N520. Transistor Q521 includes an emitter that is coupled to VLO, and a base and collector that are coupled to node N521. Resistor R514 is coupled between node N511 and node N520. Resistor R515 is coupled between node N512 and node N520. Current source IOSC is coupled between VHI and node N510. Current source ISWA is coupled between VHI and node N522. Current source ISWB is coupled between VHI and node N513.

Each of the current sources (IOSC, ISWA, ISWB) in current selector circuit 540 is selectively activated exclusive of one another. For example, ISWA is active when ISWB and IOSC are inactive, ISWB is active when ISWA and IOSC are inactive, and IOSC is active when ISWA and ISWB are inactive.

Transistors Q514, Q515 and current source ISWA are arranged to operate as a differential pair when current source ISWA is active. Transistors Q512, Q513 and current source ISWB are arranged to operate as a differential pair when current source ISWB is active. The cross-coupled connection of the collectors of transistors Q512, Q515 and Q513, Q514 are arranged to provide a phase-reversal in the switching of the output currents at nodes N511 and N512. Transistors Q514 and Q512 are responsive to the signal at node N516, while transistors Q515 and Q513 are responsive to the signal at node N517.

Transistors Q510, Q511 and current source IOSC are arranged to operate as a differential pair when current source IOSC is active. Transistors Q510, Q511 are responsive to the OSCP and OSCN signals. An oscillator (e.g., OSC 550) is arranged to drive the OSCP and OSCN signal lines with a differential oscillator signal such that a modulated output current can be provided at the output of the driver circuits. Transistor Q510, transistor Q511, and current source IOSC can be eliminated in applications where only a DC current is desired.

The transistors illustrated in FIG. 5 are BJTs. However, the same circuit configuration is equally applicable for FETs. Other example circuits that perform the functions described above are considered within the scope of the present invention.

First Exemplary Bias Current Control Circuit

Figure 6:
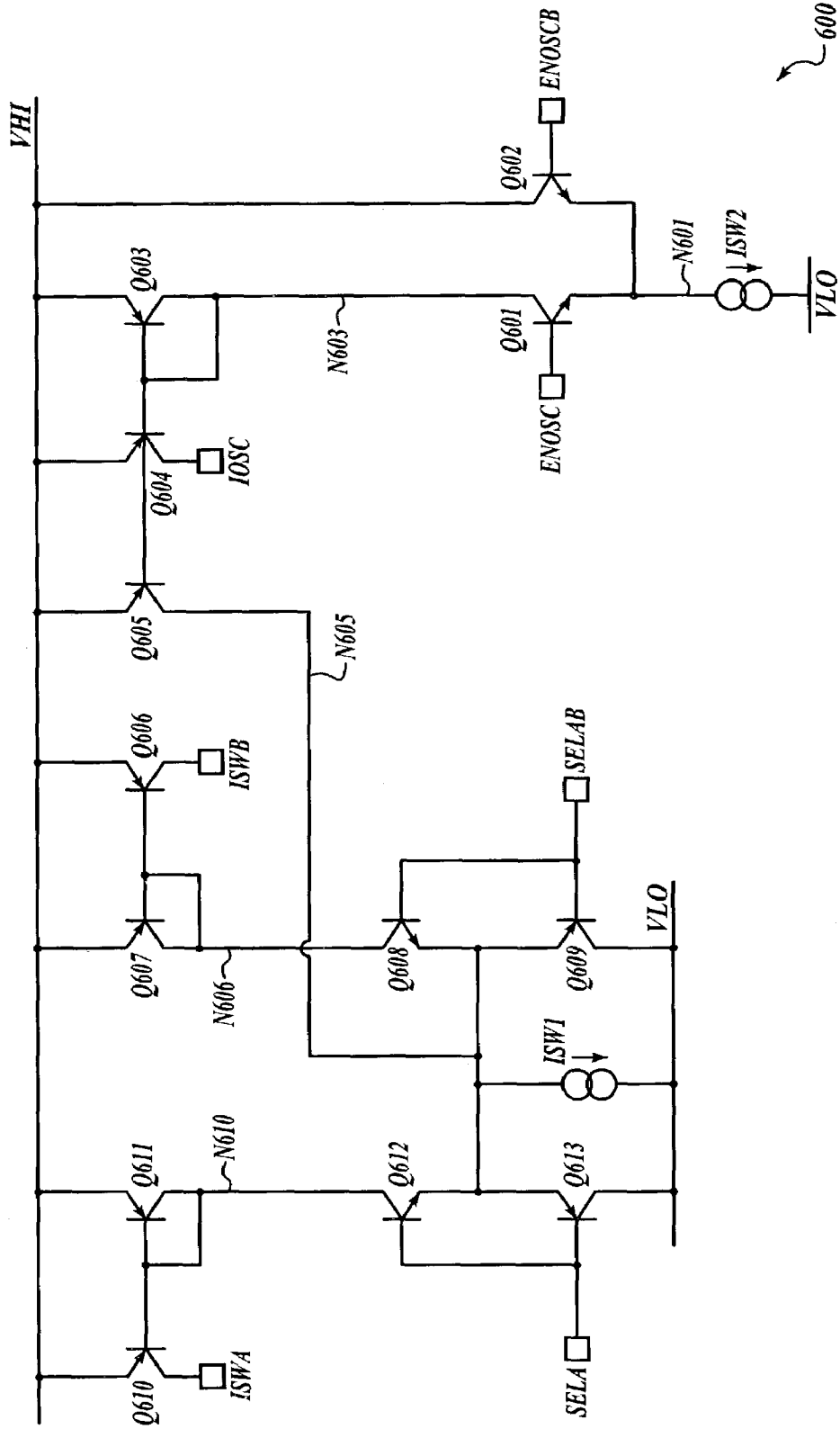
FIG. 6 is a schematic diagram of an exemplary bias current control circuit.

FIG. 6 is a schematic diagram of an exemplary bias current control circuit (600) that is arranged in accordance with the present invention. Bias current control circuit 600 includes thirteen transistors (Q601–Q613), and two current sources (ISW1, ISW2).

Transistor Q601 includes an emitter that is coupled to node N601, a base that is coupled to ENOSC, and a collector that is coupled to node N603. Transistor Q602 includes an emitter that is coupled to node N601, a base that is coupled to ENOSCB, and a collector that is coupled to VHI. Transistor Q603 includes an emitter that is coupled to VHI, and a base and collector that are coupled to node N603. Transistor Q604 includes an emitter that is coupled to VHI, a base that is coupled to node N603, and a collector that is coupled to IOSC. Transistor Q605 includes an emitter that is coupled to VHI, a base that is coupled to node N603, and a collector that is coupled to node N605. Transistor Q606 includes an emitter that is coupled to VHI, a base that is coupled to node N606, and a collector that is coupled to ISWB. Transistor Q607 includes an emitter that is coupled to VHI, and a base and collector that are coupled to node N606. Transistor Q608 includes an emitter that is coupled to node N605, a base that is coupled to SELAB, and a collector that is coupled to node N606. Transistor Q609 includes an emitter that is coupled to node N605, a base that is coupled to SELAB, and a collector that is coupled to VLO. Transistor Q610 includes an emitter that is coupled to VHI, a base that is coupled to node N610, and a collector that is coupled to ISWA. Transistor Q611 includes an emitter that is coupled to VHI, and a base and collector that are coupled to node N610. Transistor Q612 includes an emitter that is coupled to node N605, a base that is coupled to SELA, and a collector that is coupled to node N610. Transistor Q613 includes an emitter that is coupled to node N605, a base that is coupled to SELA, and a collector that is coupled to VLO. Current source ISW1 is coupled between node N605 and VLO. Current source ISW2 is coupled between node N601 and VLO.

As described previously with respect to FIG. 5, each of the current sources (IOSC, ISWA, ISWB) in current selector circuit 540 is selectively activated exclusive of one another. Bias current control circuit 600 is arranged to provide the ISWA current when ENOSC is low, and SELA is high. Bias current control circuit 600 provides the ISWB current when ENOSC is low, and SELA is low. Bias current control circuit 600 provides the IOSC current when ENOSC is high.

Transistor pair Q610, Q611 provides current ISWA in response to current ISW1. The level associated with current ISWA is determined by the ratio associated with transistors Q610 and Q611. Transistor pair Q606, Q607 provides current ISWA in response to current ISW1. The level associated with current ISWA is determined by the ratio associated with transistors Q606 and Q607. Transistor pair Q603, Q604 provides current IOSC in response to current ISW2. The level associated with current IOSC is determined by the ratio associated with transistors Q603 and Q604.

The transistors illustrated in FIG. 6 are BJTs. However, the same circuit configuration is equally applicable for FETs. Other example circuits that perform the functions described above are considered within the scope of the present invention.

Second Exemplary Bias Current Control Circuit

Figure 7:
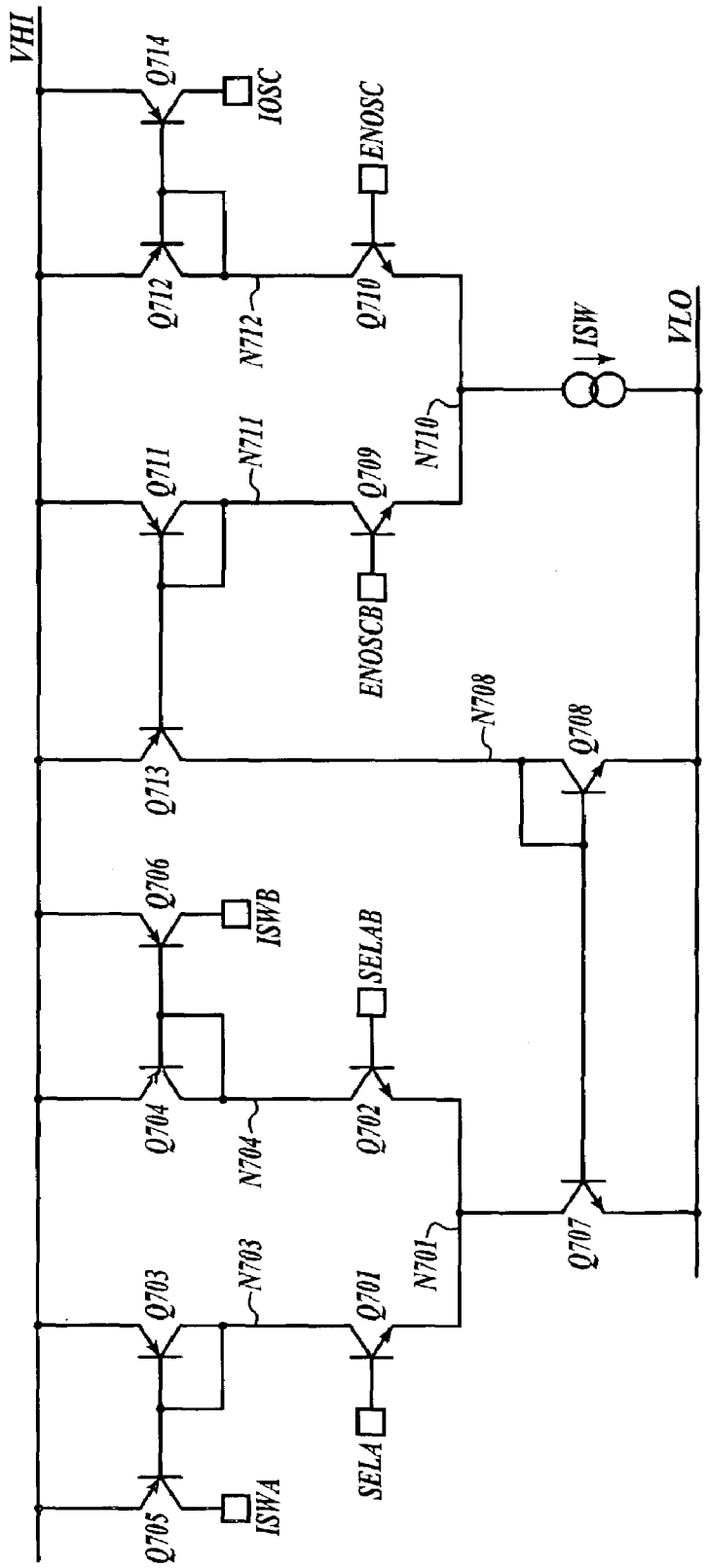
FIG. 7 is a schematic diagram of another exemplary bias current control circuit, in accordance with the present invention.

FIG. 7 is a schematic diagram of another exemplary bias current control circuit (700) that is arranged in accordance with the present invention. Bias current control circuit 700 includes fourteen transistors (Q701–Q714), and one current sources (ISW).

Transistor Q701 includes an emitter that is coupled to node N701, a base that is coupled to SELA, and a collector that is coupled to node N703. Transistor Q702 includes an emitter that is coupled to node N701, a base that is coupled to SELAB, and a collector that is coupled to node N704. Transistor Q703 includes an emitter that is coupled to VHI, and a base and collector that are coupled to node N703. Transistor Q704 includes an emitter that is coupled to VHI, and a base and collector that are coupled to node N704. Transistor Q705 includes an emitter that is coupled to VHI, a base that is coupled to node N703, and a collector that is coupled to ISWA. Transistor Q706 includes an emitter that is coupled to VHI, a base that is coupled to node N704, and a collector that is coupled to ISWB. Transistor Q707 includes an emitter that is coupled to VLO, a base that is coupled to node N708, and a collector that is coupled to node N701. Transistor Q708 includes an emitter that is coupled to VLO, and a base and collector that are coupled to node N708. Transistor Q709 includes an emitter that is coupled to node N710, a base that is coupled to ENOSCB, and a collector that is coupled to node N711. Transistor Q710 includes an emitter that is coupled to node N710, a base that is coupled to ENOSC, and a collector that is coupled to node N712. Transistor Q711 includes an emitter that is coupled to VHI, and a base and collector that is coupled to node N711. Transistor Q712 includes an emitter that is coupled to VHI, and a base and collector that is coupled to node N712. Transistor Q713 includes an emitter that is coupled to VHI, a base that is coupled to node N711, and a collector that is coupled to node N708. Transistor Q714 includes an emitter that is coupled to VHI, a base that is coupled to node N712, and a collector that is coupled to IOSC. Current source ISW is coupled between node N710 and VLO.

As described previously with respect to FIG. 5, each of the current sources (IOSC, ISWA, ISWB) in current selector circuit 540 is selectively activated exclusive of one another. Bias current control circuit 700 is arranged to provide the ISWA current when ENOSC is low, and SELA is high. Bias current control circuit 700 provides the ISWB current when ENOSC is low, and SELA is low. Bias current control circuit 700 provides the IOSC current when ENOSC is high.

Transistor Q701, transistor Q702, and transistor Q707 form a differential circuit with diode-connected load transistors Q703 and Q704. The differential circuit is responsive to the SELA and SELAB signals such that transistors Q705 and Q706 provide the ISWA and ISWB currents, respectively. Transistor pairs Q703, Q705 and Q704, Q706 are configured as current mirrors such that the level associated with currents ISWA and ISWB are determined by the respective ratios.

Transistor Q709, transistor Q710, and current source ISW form a differential circuit with diode-connected load transistors Q711 and Q712. The differential circuit is responsive to the ENOSCB and ENOSC signals such that transistor Q714 provides the IOSC current and transistor Q713 provides the bias current for transistor Q707 (via transistor Q708), which is configured as a current source. Transistor pair Q712, Q714 is configured as a current mirror such that the level associated with current IOSC is determined by the ratio.

The transistors illustrated in FIG. 7 are BJTs. However, the same circuit configuration is equally applicable for FETs. Other example circuits that perform the functions described above are considered within the scope of the present invention.

The circuits illustrated in FIGS. 1–7 are for illustrative purposes. Other circuit arrangements can provide similar high-speed current switching functions without departing from the spirit of the present invention.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus, comprising:
 a first output stage that is configured to drive a first current to a first output when enabled;
 a first switching circuit that is configured to disable the first output stage when active;
 a second output stage that is configured to drive a second current to a second output when enabled, wherein the first output and the second output are different from one another;
 a second switching circuit that is configured to disable the second output stage when active; and
 an output stage selector circuit that includes a first differential pair, wherein a first portion of the first differential pair is coupled to the first switching circuit and a second portion of the first differential pair is coupled to the second switching circuit such that the first differential pair selectively activates one of the first and second switching circuits.

2. The apparatus of claim 1, wherein the first and second output stages each include a first and second transistor that are arranged to operate as a current mirror, wherein each first transistor is coupled to a respective one of the first and second switching circuits, and wherein each second transistor is coupled to a respective one of the first and second outputs.

3. The apparatus of claim 2, wherein the first and second switching circuits each include a third transistor that is configured to couple the first transistor of the respective output stage to a power supply such that the first transistor is inactive and the output stage is disabled.

4. The apparatus of claim 1, the output stage selector further comprising a first push-pull circuit that is arranged to provide a first portion of a differential signal to a first input of the first differential pair in response to a first control signal, and a second push-pull circuit that is arranged to provide a second portion of the differential signal to a second input of the first differential pair in response to a second control signal.

5. The apparatus of claim 4, wherein the first push-pull circuit includes a first pair of transistors that are commonly controlled by the first control signal, and wherein the second push-pull circuit includes a second pair of transistors that are commonly controlled by the second control signal.

6. The apparatus of claim 4, the output stage selector further comprising a singled-ended to differential conversion circuit that is arranged to provide the first control signal and the second control signal in response to a reference signal and a selector signal.

7. The apparatus of claim 6, wherein the single-ended to differential conversion circuit includes a second differential pair that is configured to provide the first and second control signals in response to the selector control signal and the reference signal.

8. The apparatus of claim 7, wherein the single-ended to differential conversion circuit further comprises a first follower circuit that is arranged to provide a first portion of a second differential signal to the second differential pair in response to a first intermediate signal, a second follower circuit that is arranged to provide a second portion of the second differential signal to the second differential pair in response to a second intermediate signal, a first level shifter circuit that is arranged to provide the first intermediate signal in response to the selector control signal, a second level shifter circuit that is arranged to limit the signal level of the first intermediate signal, and a third level-shifter circuit that is arranged to provide the second intermediate signal in response to the reference signal.

9. The apparatus of claim 1, the output stage selector circuit further comprising a current driver circuit that includes a second differential pair, wherein the second differential pair is arranged to selectively steer a drive current to one of the first and second output stages.

10. The apparatus of claim 9, the current driver circuit further comprising a first push-pull circuit that is configured to provide a first portion of a differential signal to a first input of the second differential pair in response to a first control signal, and a second push-pull circuit that is arranged to provide a second portion of the differential signal to a second input of the second differential pair in response to a second control signal.

11. The apparatus of claim 10, the current driver circuit further comprising: a current selector circuit that is configured to provide the first and second control signals.

12. The apparatus of claim 11, the current selector circuit further comprising: a fourth differential pair circuit that includes a fourth differential pair and a fourth current source, a fifth differential pair circuit that includes a fifth differential pair and a fifth current source, wherein the fourth and fifth differential pairs are commonly controlled, the fourth current source is inactive when the fifth current source is active, and the fifth current source is inactive when the fourth current source is active, and wherein the fourth and fifth differential pair circuits are arranged such that the phase associated with the drive current is reversed by selective activation of the fourth and fifth current sources.

13. The apparatus of claim 12, the current selector circuit further comprising; a sixth differential pair circuit that includes a sixth differential pair and a sixth current source, wherein the sixth differential pair is controlled by a differential oscillator signal, the fourth and fifth current sources are inactive when the sixth current source is active, and the sixth current source is inactive when either of the fourth and fifth current sources is active, and wherein the sixth differential pair circuit is arranged such that the drive current is modulated when the sixth current source is active.

14. The apparatus of claim 11, the current selector circuit further comprising: a sixth differential pair circuit that includes a sixth differential pair and a sixth current source, wherein the sixth differential pair is controlled by a differential oscillator signal such that the drive current is modulated when the sixth current source is active.

15. The apparatus of claim 11, the current selector circuit further comprising: a first level shifter circuit that is configured to drive a first input of a fourth differential pair circuit in response to an EN signal, and a second level shifter circuit that is configured to drive a second input of the fourth differential pair circuit in response to an ENB signal, such that the fourth differential pair circuit provides the first and second control signals in response to the EN and ENB signals.

16. An apparatus, comprising:
a first output stage that is configured to drive a first current to a first output when enabled;
a second output stage that is configured to drive a second current to a second output when enabled, wherein the first output and the second output are different from one another; and
a current driver circuit that includes a first differential pair and a first current source, wherein the first differential pair is arranged to selectively steer a drive current from the first current source to one of the first and second output stages.

17. The apparatus of claim 16, the current driver circuit further comprising a first push-pull circuit that is configured to provide a first portion of a differential signal to a first input of the first differential pair in response to a first control signal, and a second push-pull circuit that is arranged to provide a second portion of the differential signal to a second input of the first differential pair in response to a second control signal.

18. The apparatus of claim 17, the current driver circuit farther comprising: a current selector circuit that is configured to provide the first and second control signals.

19. The apparatus of claim 18, the current selector circuit further comprising: a second differential pair circuit that includes a second differential pair and a second current source, wherein the second differential pair is controlled by a differential oscillator signal such that the drive current is modulated when the second current source is active.

20. The apparatus of claim 18, the current selector circuit further comprising: a third differential pair circuit that includes a third differential pair and a third current source, a fourth differential pair circuit that includes a fourth differential pair and a fourth current source, wherein the third and fourth differential pairs are commonly controlled, the third current source is inactive when the fourth current source is active, and the fourth current source is inactive when the third current source is active, and wherein the third and fourth differential pair circuit are arranged such that the phase associated with the drive current is reversed by selective activation of the third and fourth current sources.

21. An apparatus, comprising:
a first output stage that is configured to drive a first current to a first output via a first transistor when active, wherein the first transistor is arranged to operate as half of a first current mirror circuit;
a first switching circuit that is configured to disable the first current mirror circuit in the first output stage when active;
a second output stage that is configured to drive a second current to a second output via a second transistor when active, wherein the second transistor is arranged to operate as half of a second current mirror circuit;
a second switching circuit that is configured to disable the second current mirror circuit in the second output stage when active; and
an output stage selector circuit that includes a first differential pair, wherein a first portion of the first differential pair is coupled to the first switching circuit and a second portion of the first differential pair is coupled to the second switching circuit such that the first differential pair selectively activates one of the first and second switching circuits.

22. An apparatus, comprising:
a first output stage that is configured to drive a first current to a first output when active;
a first switching circuit that is configured to disable the first output stage when active;
a second output stage that is configured to drive a second current to a second output when active;

a second switching circuit that is configured to disable the second output stage when active; and an output stage selector circuit that includes a first differential pair, a first push-pull circuit, and a second push-pull circuit, wherein a first portion of the first differential pair is coupled to the first switching circuit, a second portion of the first differential pair is coupled to the second switching circuit, the first push-pull circuit that is arranged to provide a first portion of a differential signal to a first input of the first differential pair in response to a first control signal, and the second push-pull circuit that is arranged to provide a second portion of the differential signal to a second input of the first differential pair in response to a second control signal, wherein the first differential pair is arranged to selectively activate one of the first and second switching circuits.

* * * * *